United States Patent [19]

Hansen, III et al.

[11] Patent Number: 5,031,068
[45] Date of Patent: Jul. 9, 1991

[54] LIQUID LEVEL CONTROL SYSTEM FOR REFRIGERATION APPARATUS

[75] Inventors: Charles C. Hansen, III, Hinsdale; John A. Yencho, Elmhurst, both of Ill.; William J. Barbier, Hazelwood, Mo.; Curtis H. Knapp, Aurora, Ill.; Orval J. Kuhn, Jr., Warrenville, Ill.

[73] Assignee: Hansen Technologies Corporation, Burr Ridge, Ill.

[21] Appl. No.: 278,350

[22] Filed: Dec. 1, 1988

Related U.S. Application Data

[62] Division of Ser. No. 117,305, Nov. 6, 1987, Pat. No. 4,809,129.

[51] Int. Cl.$^5$ ............................................. G01R 27/26
[52] U.S. Cl. .................................... 361/284; 361/280; 324/673; 324/684; 324/689; 340/620
[58] Field of Search ............... 361/284, 280, 278, 181, 361/178, 160, 281–283, 285, 286; 324/61 R, 61 P, 74, 686, 689, 660, 664, 665, 666, 669, 670, 672, 673, 679, 680, 684, 685; 340/620; 307/118, 254, 360, 361, 308; 62/125; 137/392; 73/304 C; 323/313; 330/256, 289

[56] References Cited

U.S. PATENT DOCUMENTS

| | | | |
|---|---|---|---|
| 3,397,715 | 8/1968 | Fathauer | 361/178 X |
| 4,067,225 | 1/1978 | Dorman et al. | 73/1 DV |
| 4,173,893 | 11/1979 | Hedrick | 73/304 C |
| 4,212,005 | 7/1980 | Hubert et al. | 340/603 |
| 4,231,025 | 10/1980 | Turner, Jr. | 340/521 |
| 4,316,174 | 2/1982 | Sutton et al. | 340/620 X |
| 4,460,864 | 7/1984 | Ray | 323/313 |
| 4,480,200 | 10/1984 | Tan et al. | 307/354 |
| 4,483,463 | 11/1984 | Buschmann | 222/64 |
| 4,497,033 | 1/1985 | Hernandez et al. | 364/551 |
| 4,528,839 | 7/1985 | Blanchard et al. | 73/1 H |
| 4,806,847 | 2/1989 | Atherton et al. | 324/665 X |
| 4,809,129 | 2/1989 | Hansen, III et al. | 361/284 |

*Primary Examiner*—A. D. Pellinen
*Assistant Examiner*—David Osborn
*Attorney, Agent, or Firm*—James N. Videbeck

[57] ABSTRACT

An improved capacitance bridge type liquid level control system for use in refrigeration applications is disclosed which provides improved apparatus for sealing the probe in its mounting and for insulating same against the condenser reservoir stand pipe in which it is mounted. Improved sealing between the probe and probe body is accomplished through an annular PTFE seal which when compressed pushes inwardly to seal a tubular PTFE insulation against annular ridges in the side of the probe rod proper. The improved probe rod shape also maintains a proper stabilized axial alignment between the probe rod and the probe body. Improved circuitry for the capacitance bridge liquid level control system includes a built-in simulation circuit for testing the apparatus, improved voltage feedback damping for providing a stable circuitry utilizing digital display, light emitting diodes, improved anti-splashing circuitry for stabilizing digital display read out, and a reversed lower differential function setting for enabling the low level adjustment set point to be set more accurately heretofore known.

8 Claims, 5 Drawing Sheets

LIQUID LEVEL CONTROL SYSTEM FOR REFRIGERATION APPARATUS

This is a division of application Ser. No. 07/117,305 filed on Nov. 6, 1987, and patented on Feb. 28, 1989 as U.S. Pat. No. 4,809,129.

BACKGROUND OF THE INVENTION

This invention relates generally to improvements in capacitance bridge type liquid level controls for refrigeration systems and, more particularly, to improvements in the probe which is mounted in the receiver vessel, low pressure accumulator, or other reservoir to be monitored, and to the electrical circuitry which takes capacitance readings between the probe and refrigerant holding vessel and acts in response to those readings to assure proper liquid levels of a saturated refrigerant in a pressure containing vessel.

Large compression type refrigeration systems typically used in refrigerated storage warehouses and refrigerated process cooling applications where the level of the liquid refrigerant in the low temperature accumulator must be controlled to prevent the liquid refrigerant overflowing the accumulator and passing back to the compressor suction, and to provide sufficient liquid refrigerant to handle the cooling load to the evaporator. The refrigerant liquid level is typically maintained by a solenoid valve which is cycled on and off by the liquid level control. The result is a continuous change in liquid level causing surges and splashing of the liquid refrigerant in the vessel.

Capacitance bridge type liquid level controls determine the level of a saturated refrigerant in a pressure containing accumulator vessel by inserting a metal electrically conductive probe into the liquid, insulating the probe from the liquid and the vessel, and reading the capacitance between the probe and the vessel. As the liquid level in the vessel rises and lowers the capacitance between the probe and the vessel changes. Setting and calibration of the probe-vessel capacitor allows one to determine the level of liquid in the vessel. When the capacitance bridge liquid level controls are used in closed refrigerant systems wherein a refrigerant such as freon or ammonia is used under pressure, changes in pressure, temperature and relative expansion or contraction between the probe, the electrical insulation for the metallic probe and the aperture in the vessel wall through which the probe is inserted make the sealing between these elements fraught with problems. Attempts at sealing the steel rod probe and the predominantly used annular polytetraflouroethylene (PTFE) insulation around the rod have been accomplished by annular inward pressure between the smooth outer rod surface and the smooth inner PTFE surface caused by means of tapered collars or nuts positioned annularly around the outside of the PTFE tube which are sandwiched and squeezed between threadedly connected housings. A need has arisen for improving the seal between the cylindrical rod probe and the tubular insulating PTFE material therearound.

In heretofore known electronic control circuits for capacitance bridge liquid level controls, the circuitry has been calibrated or recalibrated by disconnecting the probe from the control circuit and inserting a variable capacitor in place of the probe. After calibrating the circuit, the temporary capacitor is removed and the probe again connected into the circuit. A need has arisen for a built-in circuit in the capacitance bridge electronic control system so the unit may be tested to determine if it is correctly operating while leaving the electrical circuitry intact.

Certain heretofore known electronic circuitry for capacitance bridge liquid level controls have included transmitting circuitry positioned near the end of the probe rod to minimize the base level capacitance in the system. Other known capacitance bridge liquid level controllers have used analog meters or liquid crystal displays to display readings of the liquid level in the system. Combining the use of LED seven segment digital displays with a low cost display driver has created a need to compensate for the power supply noise created by the relatively large current draw which occurs when the digits are changed sequentially from a LED combination which draws relatively little current to a LED combination which draws substantially more current.

In heretofore known capacitance bridge liquid control systems, the effect of refrigerant splashing in the vessel from boiling action at the liquid surface, or from quick entry or exit of refrigerant from the reservoir was dampened in part by liquid level differential controls for which adjustment could be set downwardly from the initial set point of the circuitry to turn off the indicator turned on when liquid reached the level of the set point. This necessitated setting the low point reading up above the actual desired low point by the amount of the differential setting. A need has arisen to provide better circuitry to deal with violent liquid splashing in the system, and to make changes in the differential circuitry of the low point level adjustment control.

Therefore, it is an object of the invention, generally stated, to provide a new and improved probe for a capacitance bridge liquid level control system for use in refrigeration applications.

Another object of the invention is to provide improved electronic circuitry for a capacitance bridge liquid level control system for use in connection with refrigeration systems.

SUMMARY OF THE INVENTION

The invention is found in a probe for a capacitance bridge liquid level control system wherein the probe includes a generally cylindrical elongate steel rod having a predetermined length. An electrical conductor of known resistance is attached on one end of the elongate rod and is operatively connectable to a signal amplifier circuit. A tubular insulator surrounds the elongate steel rod, and a generally tubular first probe body member having a bore therethrough through which the rod and tubular insulator are positioned. At least a portion of the bore has a diameter sufficiently larger than a diameter of the tubular insulator to define an annular space between the body bore and the tubular insulator. A generally tubular second probe body has a bore therethrough which is sized to closely fit around a portion of the outside of the tubular insulator and is adapted for selective axial movement with respect to the bore on the tubular first probe body, and selectably lockably engageable with the first tubular probe body.

The invention further includes deformable tubular means fitting around the tubular insulator in the annular space between the bore on the first probe body member and the tubular insulator, for applying inward radial force on the tubular insulator when the second probe body member is moved axially with respect to the first probe body member to deform the insulator inward toward the cylindrical outer surface of the steel rod as a seal therebetween. The improvement comprises an annular indentation around the elongate steel rod at a position radially inwardly of the deformable tubular means for receiving a portion of the tubular insulator therein to improve the sealing capabilities between the steel rod and the tubular insulator.

The invention further resides in a capacitance liquid level control system for measuring the level of a liquid in a vessel wherein the system is of the type having a power supply, a signal generating oscillator, a capacitance bridge circuit for receiving a signal from the oscillator wherein a probe provides one plate of a capacitor thereof, and the bridge circuit being adapted for having a wall of a vessel provide an opposing plate of the capacitor, wherein a change in the liquid level in the vessel causes a variance in the capacitance of the capacitor.

The invention further includes a signal amplifying circuit for receiving and amplifying the signal from the capacitance bridge circuit, a level control circuit for receiving the amplified signal from the signal amplifying circuit comparing it to a predetermined desired signal, and a display driver circuit for digitally displaying the amplified signal as a percentage of a full scale reading. An improvement for stabilizing the amplifier in the amplifying circuit includes a reference voltage connected to the display driver circuit and the signal amplifier circuit to display the reference voltage as a 0 percent of full scale reading, and means for regulating fluctuation in input of the signal amplifier circuit about the reference voltage. The means for regulating the input of the signal amplifier circuit balancing rapid current draw by the display driver circuit with the supply voltage varying but remaining constant relative to the 0 reading output of the display driver circuit.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, wherein like reference numerals identify like elements throughout and in which:

DETAILED DESCRIPTION OF THE PREFERRED EMBODIMENT

Figure 1:
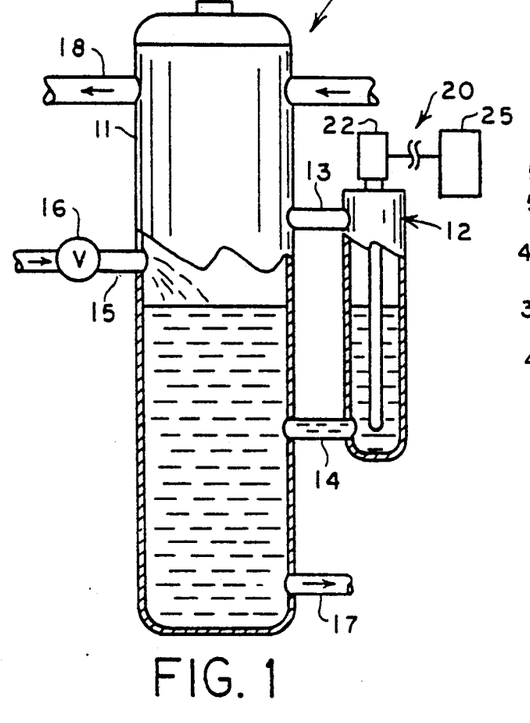
FIG. 1 is a vertical elevational view, with portions cut away, of a system accumulator reservoir including a capacitance bridge liquid level control system constructed in accordance with the present invention.

Referring to FIG. 1, an accumulator reservoir generally indicated at 10 includes a generally cylindrical vessel 11 having a stand pipe 12 mounted in vertical position adjacent thereto and connected in fluid communication with the vessel at tubular connections 13, 14. The vessel has an upper inlet port 15 with a solenoid controlled valve 16 thereon, and a lower reservoir outlet port 17. An outlet port to the refrigeration compressor suction is shown at 18 extending through vessel 11. The capacitance bridge liquid level control system, generally indicated at 20, which includes a probe network 21 (FIG. 4a) consisting of an oscillator 63, capacitance bridge 64, and rectifier 65, mounted in a probe board housing 22 positioned on top of a metal rod type probe 23 (FIG. 2) which, in turn, is mounted in stand pipe 12. It will be understood that the standpipe 12 and the probe 23 may be mounted within the vessel Additionally, the circuitry from the probe board and housing 22 is fed into a level control network mounted on a level control board 24 (shown in FIGS. 4b and 4c) which is mounted in a liquid level control housing 25.

Generally, in operation the liquid level control system 20 controls the operation of solenoid operated valve 16 to allow refrigerant, whether freon, ammonia, or some other refrigerant liquid, to enter into the reservoir 10. The capacitance bridge liquid level control system 20 forms a giant capacitor between the probe 23 and the outside wall of stand pipe 12. The level control system is then calibrated for the value at the bottom of the probe, and for the value adjacent the top of the probe where the reservoir is considered full. The change in capacitance between the empty and full readings is linear. When using a refrigerant of low viscosity, any rapid cycling of the system on and off, rapid withdrawal of refrigerant through outlet pipe 17, and violent boiling of the refrigerant at its surface causes splashing or temporary differences in the liquid level in the reservoir 10. Most liquid level control systems operate with three level functions: an ideal level control for the refrigerant in the reservoir, and upper and lower liquid level alarm sets.

Figure 2:
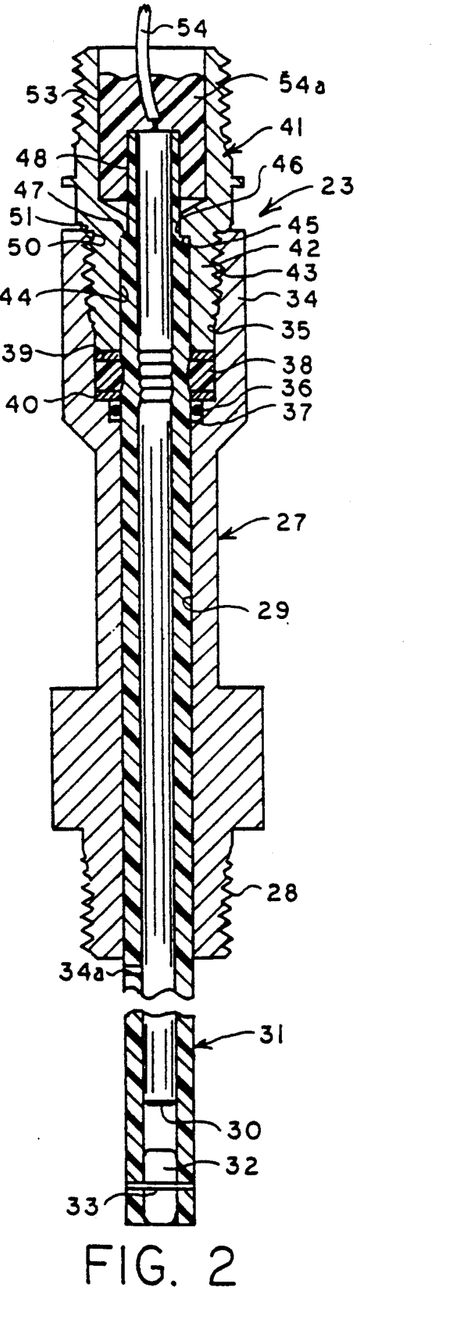
FIG. 2 is a cross-section of the probe as it would appear if taken generally along the line 2—2 of FIG. 1, with the probe rod shown in full.
Figure 3:
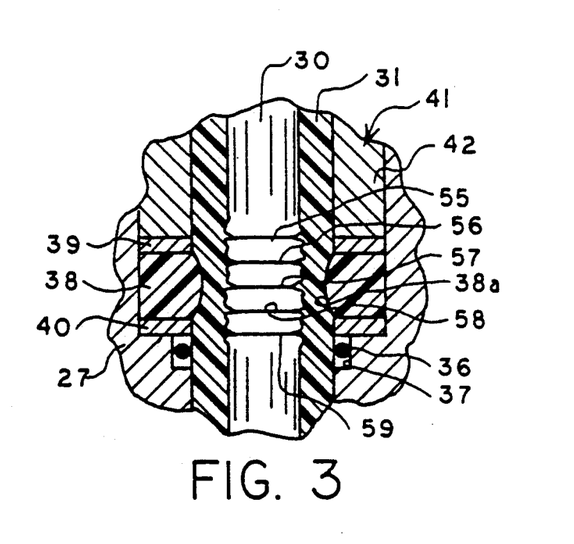
FIG. 3 is an enlarged fragmentary view of a portion of the cross in FIG. 2 showing the probe, insulation and packing used to securely position the probe in a probe body or housing.

Referring to FIGS. 2 and 3, the probe 23 includes a hollow generally tubular probe body 27, preferably made of stainless steel, which is sealingly connected at threads 28 to the top of stand pipe 12 (FIG. 1). The probe body 27 includes a hollow central bore 29 therethrough in which the stainless steel rod type probe 30 and its surrounding tubular PTFE insulation 31 are retained. Adjacent the bottom of the tubular PTFE insulation 31, is positioned a PTFE plug 32 which is held in position by pin 33. Closely subjacent the bottom of the probe body 27, a small vent hole 34a is positioned radially through the tubular PTFE insulation 31 to equalize pressures in the annular volume between the rod 30, the tubular insulation 31, and the volume between the end of the rod and the PTFE plug 32 with the pressure in vessel 11. Any leakage of refrigerant into that area may cause erroneous readings in the system, and the vent hole provides for the escape of vapors from any such leakage while being positioned sufficiently high above the liquid level not to allow any ingestion of refrigerant therein.

While venting between the steel rod probe 30 and its surrounding insulation 31 is desirable inside the vessel, an efficient seal between the probe rod 30, the surrounding insulation 31, and the central bore 29 of the probe body is necessary when maintaining a closed refrigeration system. The top of the probe body 27 includes an annular flange 34 having an inner bore 35 of increased size from the remainder of the bore 29 therebelow for receiving an 0-ring secondary seal 36 which is set in an annular pocket 37 at the bottom thereof, and as a primary seal, an annular PTFE packing 38 which is sandwiched between top and bottom steel packing washers 39 and 40, the complete function of which will be discussed below. Atop the packing material, a tubular probe adapter 41 is mounted and may be likened somewhat to a packing nut on a valve assembly. The probe adapter 41 includes a lower annular flange 42 which is threaded at 43 on its outside for mating threaded engagement with the inside top of the probe body annular flange 34, and an inner bore 44 adapted to closely fit the outside of PTFE tubular insulation 31. At the upper end of bore 44, adapter 41 includes a radially extending shoulder 45 ending in a smaller bore 46 which is adapted to fit and retain a complementary shoulder 47 and smaller outer diameter 48 on the PTFE insulation 31. The shoulder 45 on probe adapter 41 is adapted to retainingly engage the shoulder 47 on the tubular insulator 31 to retain same in position axially, as the pressure differential between the inside and the outside the vessel 10 tends to push the probe and everything in it outwardly or axially upwardly as the apparatus is shown in FIG. 2.

Figure 4A:
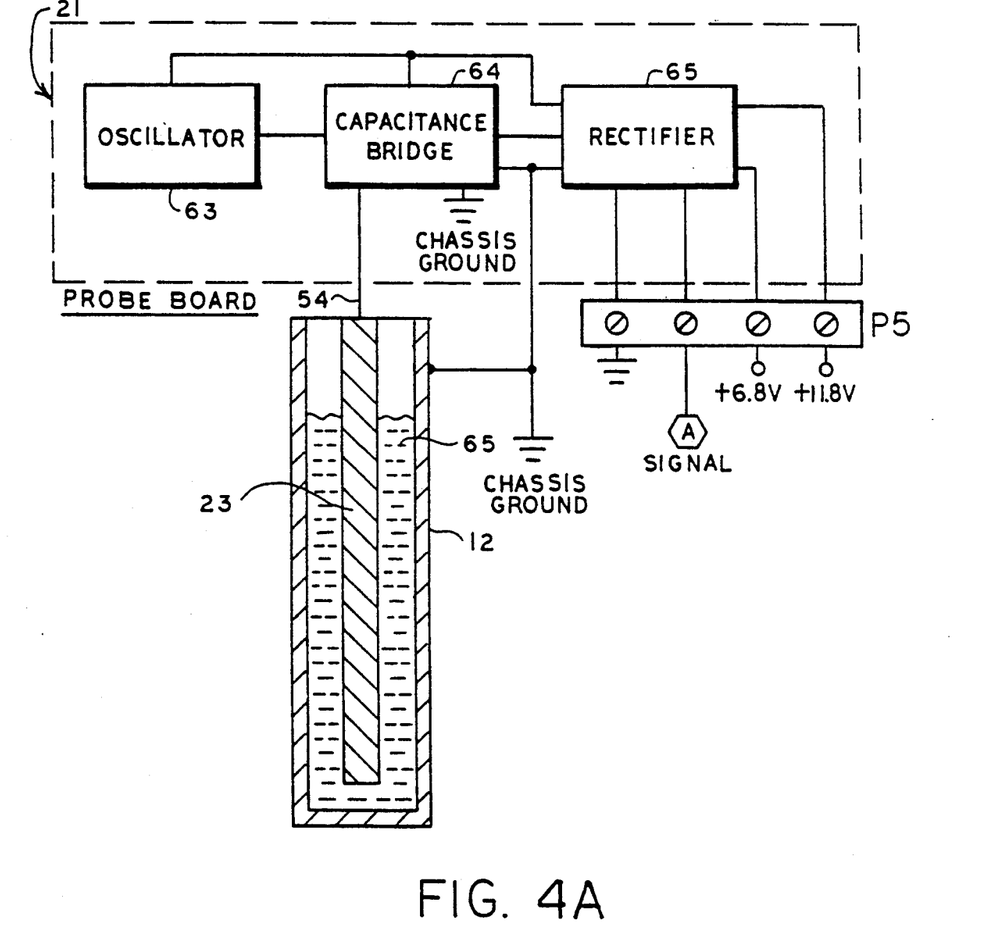
FIG. 4a is a schematic diagram of the probe and transmitter or probe board portion of the level control circuitry.

An additional secondary seal between the probe adapter 41 and the annular flange 34 of probe body 27 is a metal to metal knife edge seal formed by a frusto-conical surface 50 inwardly adjacent the top of annular flange 34, and an annular 90 degree shoulder 51 formed on the probe adapter to engage the frusto-conical surface 50 when the adapter 41 is threadedly received in the upper end of the probe body 27. The upper end of the probe adapter 41 includes an annular flange 53 which is threaded on the outside to receive the transmitter housing 22 (FIG. 1) and hollow on the inside to provide a short space, approximately 3 inches or shorter in length for positioning a insulated conducting wire 54 in current conducting communication with the top of the probe rod 30 and the probe transmitter circuitry 21 (FIG. 4a). The remainder of the hollow interior at the top of the probe adapter 41 is potted in known manner as shown at 54a to additionally seal and insulate the probe.

Referring to FIGS. 2 and 3, in one aspect of the present invention a plurality of annular grooves 55-59 are positioned axially along the outside of probe rod 30 at a location which is radially inwardly adjacent the PTFE packing 38 positioned in the bore 35 of upper annular flange 34 on the probe body 27. As shown most clearly in FIG. 3, when the probe adapter 41 is tightened downwardly on probe body 27, the inside wall 38a of PTFE packing 38 is deformed inwardly which in turn inwardly deforms the inside wall of tubular PTFE insulation 31 surrounding the annular grooves 55-59 and pushes the tubular PTFE insulation 31 inwardly into those grooves 55-59 which not only creates an improved seal between the probe 30 and tubular PTFE insulation 31, but also restrains the probe 30 from axial movement with respect to the PTFE insulation 31, and in turn, the probe body 27.

The combination of the seal between the probe 30 and the tubular PTFE insulation 31 caused by that insulation being pushed into grooves 55-59, and the seal between the probe body 27 and the PTFE insulation 31 caused by the deformation of the annular PTFE packing 38 against both the probe body 27 and the tubular PTFE insulation 31 creates an improved primary seal for the capacitance probe, and the addition of the O-ring seal 36 subjacent the annular packing 38, and the knife edge seal between the probe adapter at 51 and the frusto-conical surface 50 of the upper annular flange of the probe body 27 provides improved secondary seal between the probe insulation 31 and the probe body 27.

Figure 4B:
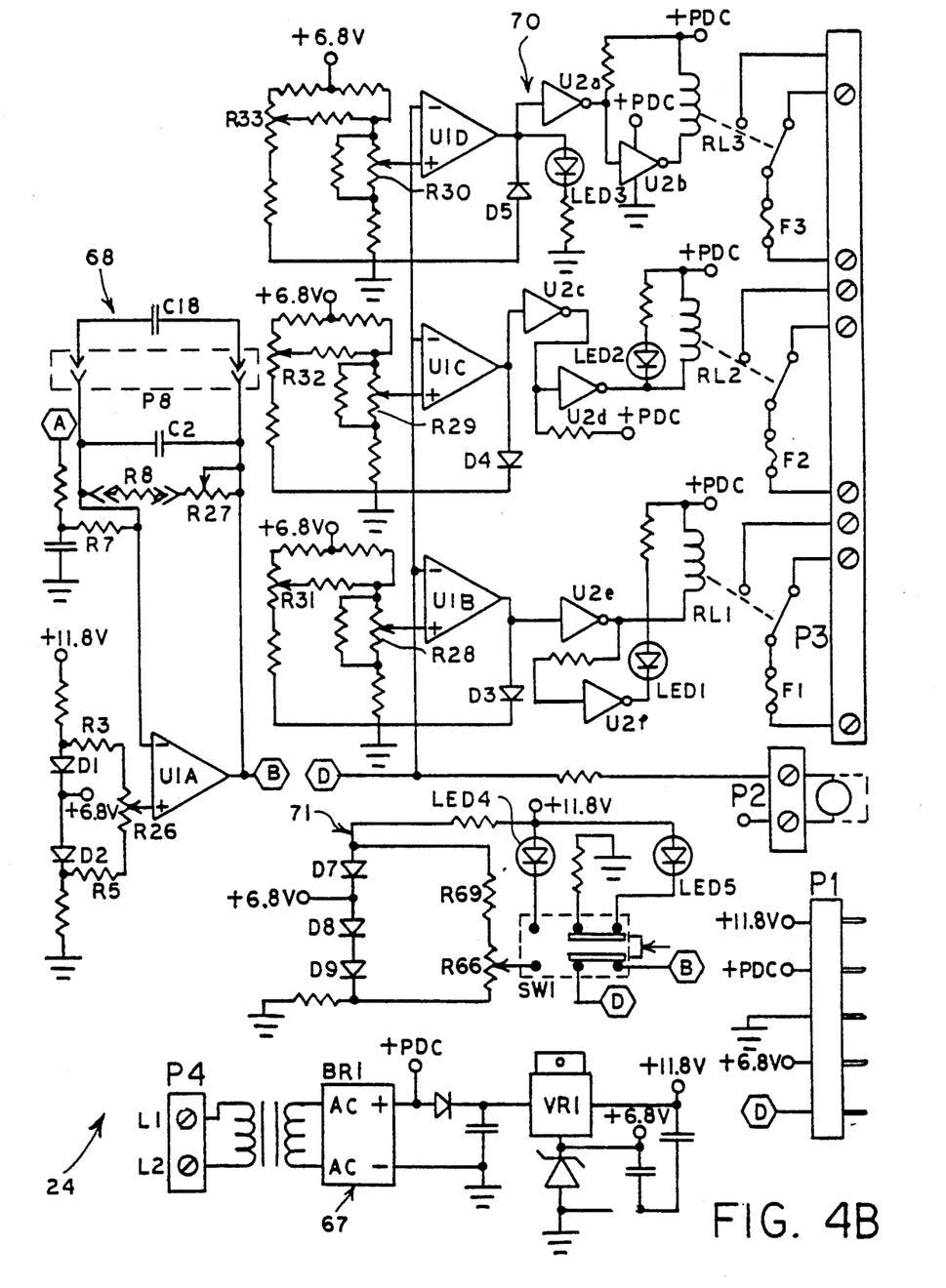
FIG. 4b is a schematic diagram of the level control circuit, signal amplifier circuit, power supply and simulator circuit for the control system.

Referring to FIGS. 4a, 4b, 4c and 5, the liquid level control system of the present invention includes a power supply network 67 shown generally in connection with terminal strip P4 in FIG. 4b which supplies 15 volt PDC, 11.8 volt DC and 6.8 volt DC power to the various networks of the system. A signal transmitting network or probe board network 21 is shown schematically in FIG. 4a and includes an oscillator 63 which sends a square wave running at high frequency such as 20,000 hz, into a capacitance bridge 64. The high frequency square wave passes through the capacitor formed by the probe 23, the dielectric formed by the refrigerant liquid 65 and the gas in the vessel, and the grounded metal wall of the standpipe 12.

The capacitance change of the signal transmitter or probe network 21 is determined by the dielectric constant (K) of the liquid. For example, ammonia liquid has a K equal to 15.5 and ammonia gas has a K equal to 1.007 (K values are from the 1981 ASHRAE Handbook of Fundamentals). The higher K values of the liquid will allow more current to pass through the probe circuit when the liquid level is high. The actual change in current will be linear with the change in liquid level.

Figure 4C:
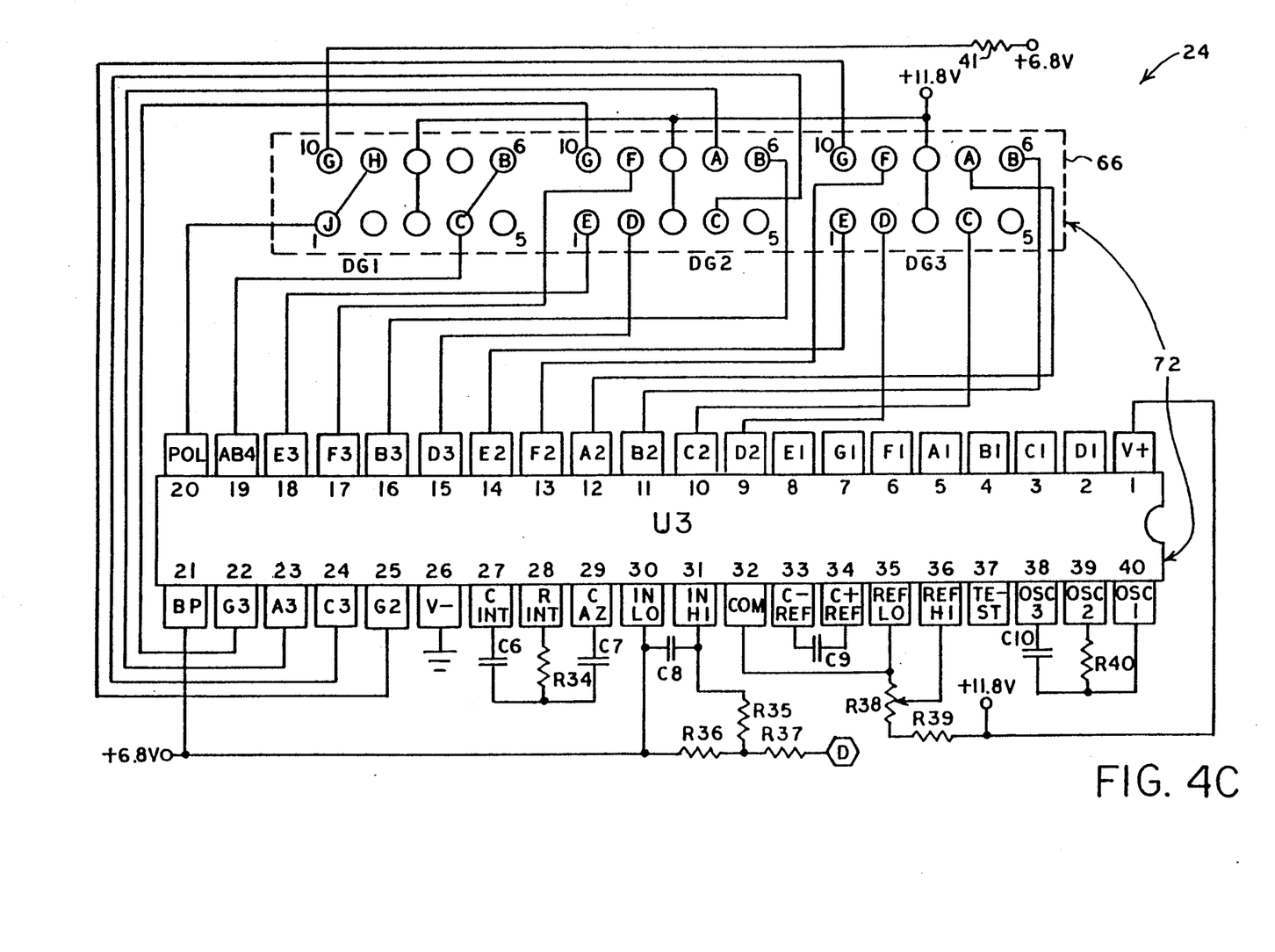
FIG. 4c schematic diagram showing the LED digital display and integrated circuit for driving the digital display.

As the electric current flowing through the probe/refrigerant/stand pipe capacitor increases with the increasing liquid level, it changes the balance of the capacitance bridge 64. This results in a change in the voltage output from the capacitance bridge 64, which is rectified to direct current through rectifier 65, which goes from there through connector P5 to a connecting four wire cable to the level control board 24. Aside from the power supply network 67, the level control board 24 includes a level signal amplifier network 68 including the input and output sides of amplifier U1A in FIG. 4b. A level setting and control schematic network 70 includes operational amplifiers U1B, U1C, U1D and the circuitry in connection with relays RL1, RL2 and RL3 in FIG. 4b, is also a part of level control board 24. The level control board 24 further includes a simulator network 71 starting at switch SW1 in FIG. 4b, and a digital display driver network 72 shown in 4c.

With respect to the power supply, the 6.8 volt DC is used as a median point or reference voltage to allow the generation of (+) and (−) voltages relative to the 6.8 volt DC. 6.8 volt DC is connected to the (−) pin U3-21 and the zero digit reference of the display driver, pin U3-30 shown in FIG. 4c, so that 0 percent of liquid level above the probe bottom corresponds to the 6.8 volt DC above circuit ground.

With respect to the digital display network 72 shown in FIG. 4c, the digital LED display driver U3 used in this invention is commonly sold under the trademark and model number Intersill 7107. As such, the parts shown with U3 are typical for this integrated circuit. The segment type digital display 66 is a group of light emitting diodes (LED) which display a + or − DC voltage which has been scaled with variable resistors R26 and R27 (FIG. 4b) to match the liquid level on the probe 23 so that the display can represent the percent of probe length covered with liquid refrigerant. Variable resistor R26 is used to set the digital display 66 at 0 percent when the probe board network 21 (FIG. 4a) sees only gaseous refrigerant. Likewise, variable resistor R27 is used to set the digital display 66 at 100 percent when the probe 23 is completely immersed in liquid refrigerant 65. The level indicating voltages are applied to digital display driver U3 at pin U3-31 which is the input pin for the voltage to be displayed. Pins U3-32, U3-35 and U3-36 form the reference voltage to indicate the voltage which will be displayed as 100 percent.

In connection with the integrated circuit for driving the display, operation of the LED display 66 is usually sequential, whereby a change from, for example, the numeral 1 to the numeral 8, causes a relatively large current draw which changes the signal voltage. In a control system such as in the present invention where the current draws are kept to minimal levels, this relatively big change in current draw may feedback through parts of the remainder of the circuit and cause erratic operation of the very sensitive circuitry.

The level signal amplifying circuit around amplifier U1A in FIG. 4b not only amplifies the rectified DC signal received from the probe board network 21, but also includes circuitry, specifically with resistor R26, diode D1 and diode D2 which balances any noise or feedback from the change in current draw that occurs when the digital display readout changes sequentially. The 0 percent adjustment set by variable resistor R26, which is applied to the (+) input of the amplifier U1A, is referenced to the 6.8 volt DC supply through diodes D1 and D2. The function of diodes D1 and D2 is to limit the adjustment of the 0 percent variable resistor R26 within a band approximately 6.8 volts DC +/− .6 volt minus the voltage drops across resistors R3 and R5. By the use of this voltage regulation system, noise and feedback problems causing display and control instability are significantly reduced. One of the reasons for the improved stability of this system of providing a regulated voltage around the 6.8 volt DC supply is that this voltage system goes up and down with the noise or feedback, but at the same time is constant relative to the 0v output of the digital display 66 because the 6.8 volt DC supply is connected to the (−), pin U3-21, and the zero digit reference, pin U3-30 of the display driver U3. This interrelationship produces a balancing effect which almost completely eliminates noise problems caused by the digits going off and on.

The level signal amplifying network 68 receives a DC rectified current signal from the probe board network 21 which is relatively constant independent of the length of the four wire connection therebetween. The length of insulated conductor wire 54 used in the capacitance bridge network 21 is as short as possible, approximately 3 inches or less in length. Heretofore known capacitance bridge liquid level control systems utilizing a long coaxial cable between the top of the probe 23 and a capacitance bridge positioned remotely in a level control cabinet. This coaxial cable must be measured, cut, calibrated, and remain unchangeable, as the overall capacitance in the system varies depending on the length of the coaxial cable. Applicants' control system avoids this problem by locating the probe board network 21 in close proximity to the probe 23, turning the generated signal into DC current, and running same over a common four wire connection between the probe board circuit 21 and the remainder of the level control network 24.

The output signal from amplifier U1A feeds through switch SW1 to the level setting and control network 70, where it drives the level setting comparator U1C, upper level control comparator U1D and lower level control comparator U1B, and to the digit display driver U3 U1A, B, C and D in this application is an operational amplifier LM324, and U3 is a display driver chip INTERSIL 7107

The direct current amplified signal from amplifier U1A goes through switch SW1 from terminal B to D and then to the comparators U1C for the control level adjustment, U1D for the high level warning, and U1B for the low level warning. For the set point adjustments shown in FIG. 5, the low level variable resistor is R28, the control level variable resistor adjustment is R29, and the high level variable resistor adjustment is R30.

In heretofore known capacitance bridge liquid level control systems, a second variable adjustment has set up a variable differential function to reduce the tendency of the control relay to rapidly cycle on and off. A typical differential range is from 2 percent to 20 percent In other words, once the control relay RL3 is turned on due to apparent high liquid level at the high set point, it will stay on until the liquid level lowers by the differential amount. All heretofore known such differential ranges have operated below the liquid level set point, whether that set point was for the low level, control level, or high level set point adjustment. Therefore, the low level variable resistor R28 would not have any differential function if it were set at the zero level. To obtain a 15 percent differential function, the low level set point adjustment would have to be set to 15 percent, and the differential adjustment set for 15 percent. The differential adjustment shown in FIG. 4b for the low level set point is resistor R31, for the control level set point is resistor R32, and for the high level set point is adjustable resistor R33. Therefore, previously known low level set point adjustments have included therein a fudge factor preventing the low level set point from being a true indicator.

In one aspect of the present invention, the relay RL3 and relay drive circuitry for the high level portion of the level control differs from the relay RL2 and relay drive for the control level adjustment portion of the level control network 70 and the relay RL1 and relay drive of the low level portion of the level control network in that the direction of the differential function for the control level and the low level portion of the network are reversed from that of the high level portion of the network. The reversal in the operation of the differential functions is accomplished by reversing the diodes D4 and D3 with respect to diode D5. This configuration of D3 allows the low level adjustment of FIG. 5 to be set at the actual low level desired position with the differential function being above that low level setting.

In an additional aspect of the present invention, the relays RL3, RL2 and RL1 are set to provide fail-safe conditions in case of power failure to the level control system. Relays RL3 and RL2 require non-inverted operation, and relay RL1 requires inverted operation. If power fails to the control box, the upper limit relay RL3 opens or turns the compressor circuit (not shown) off and closes or activates the high level alarm circuit. At that time, level control relay RL2 de-energizes the feed solenoid of control valve 16 to close it and stop feeding refrigerant to the accumulator 10. Concurrently, the low level relay RL1 opens the pump circuit (not shown) to stop pumping refrigerant, and closes the low level alarm circuit (not shown).

As mentioned previously, the fact of rapid on/off cycling of the inlet valve 16 to the reservoir 10 (FIG. 1) and the draw of refrigerant through the outlet pipe 17 can cause violent splashing or instantaneous level changes in the vessel which are made worse by boiling of the liquid refrigerant in the reservoir. As the background capacitance of the improved system has been lowered from approximately 300 PFD to approximately 44 PFD for the improved circuitry disclosed herein, the sensitivity of the circuitry to these rapid changes in level control has increased. Heretofore known circuitry has also utilized the aforementioned differential functions in the level set point adjustment network to attempt to dampen the changes in the display output of the level control circuitry. Also as applicants' present circuitry utilizes digital display, rather than an analog needle type reading, the need to prevent rapidly changing display numbers, and prevent erroneous off and on actions by the control relay has increased.

In one aspect of applicants' invention, the level signal amplifier network 68 shown in connection with amplifier U1A, includes capacitors C18 and C2 installed across the negative input and output of the operational amplifier U1A, where C18, C2, R27 and R7 form a time delay in response to sudden changes in the signal voltage from the probe board network 21. The time delay is formed by the capacitor C18 and C2 which cause the voltage at the U1A (negative) input to lag the changes in signal voltage which is applied across resistor R7. The rate of voltage buildup across C18 and C2 is a function of the voltage divider formed by resistor R7 and variable resistor R27. As R27 is adjusted to smaller resistance values, the time required to drain the charge off of C18 and C2 and the damping time will be automatically shortened. In this embodiment of the invention, the amplifier gain is based upon the ratio of R27 to R7. For shorter probes where the amplification must be increased, the variable resistor R27 is adjusted to higher values so that a given percentage level change on a short probe will produce the same change in level indicating voltage as a longer probe. The result of these relationships is that shorter probes will require larger values of R27 for more gain and larger values of R27 increase the damping time delay. Also, shorter probes need more damping because of a larger effect percentage-wise of splashing, boiling and surges. Longer probes will require smaller values of R27 for less gain and smaller values of R27 decrease the damping time delay. Also longer probes need less damping because of a smaller effect percentage-wise of splashing, boiling and surges.

It is evident from the relationship stated above that the result of this circuitry is to provide automatic modification of the damping time to match the changing needs as different length probes are used with this level control system. Heretofore known capacitance bridge liquid level control systems has not provided this variable sensitivity for taking into consideration the change of sensitivity of the circuit to differing probe lengths. The present circuit is capable of changing its amplification to produce uniform response for different probe lengths used in differing sized refrigeration systems. Probe lengths typically range from 10 inches in length to up to approximately 80 inches in length. In other words, a 10 percent change on a 10 inch probe would be a one inch change in liquid level and typically a 0.5 PFD capacitance change whereas a 10 percent change on an 80 inch long probe would be an 8 inch change in liquid level and a 4 PFD capacitance change. In the present improved circuitry, adjustment of variable resistor R27 allows the system to change its amplification to provide uniform response for differing probe lengths. It should be noted that closely adjacent variable resistor R27 is a plug in resistor R8. The value of the resistor R8 depends upon the type of refrigerant to be utilized in the system.

Figure 5:
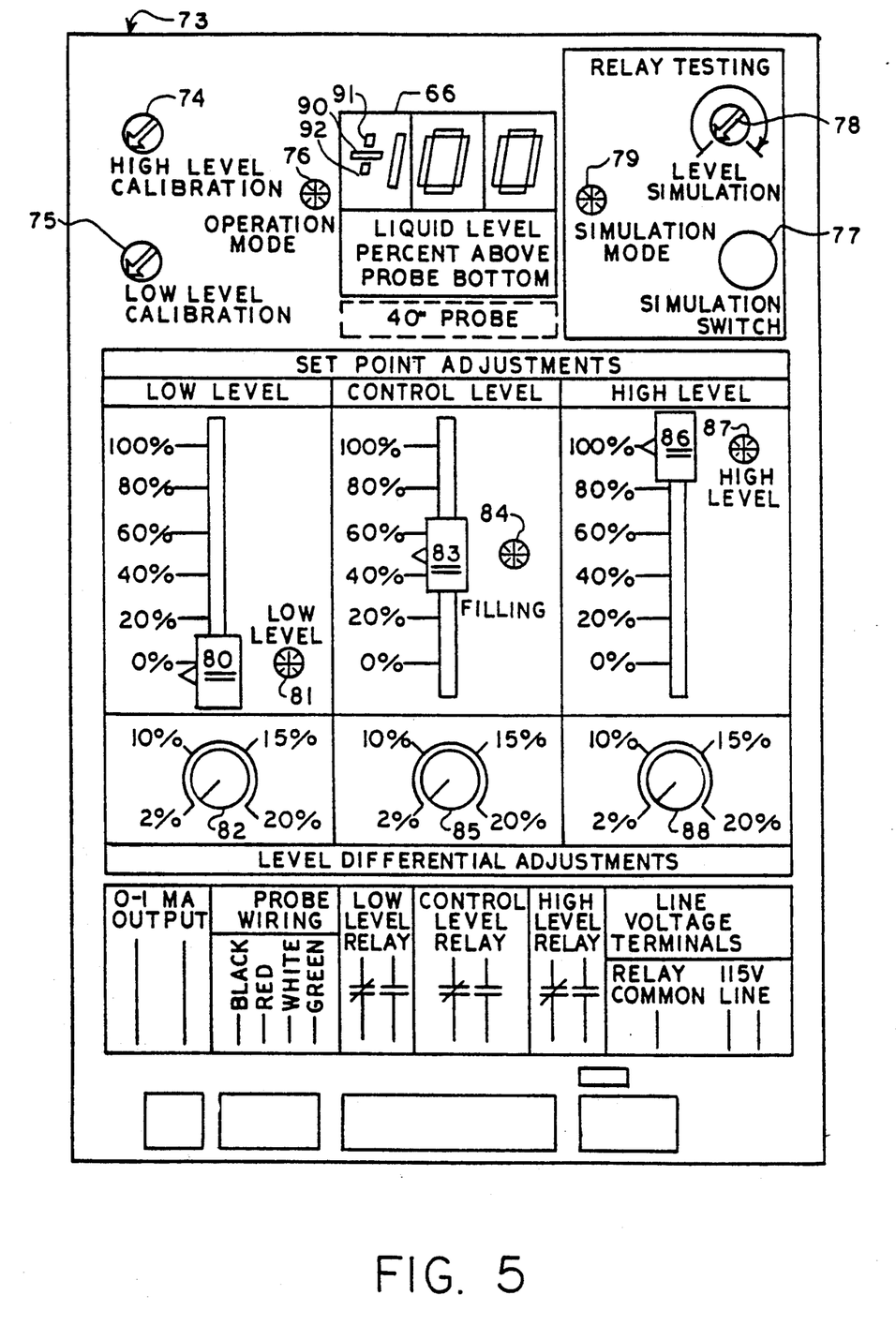
FIG. 5 is a vertical elevational view of the control panel for the capacitance bridge type liquid level control system of the present invention.

Referring to FIG. 4b, and specifically to the simulation network 71 shown in connection with switch SW1, in one aspect of the present invention this simulation circuitry is present in the liquid level control system so that the system can be tested without liquid in the reservoir, and can be tested with the circuitry intact. Previously, the probe would have to be disconnected from the remainder of the circuitry and a variable capacitor installed in its place to test the remainder of the liquid level control system. The function of the simulator network 71 is to allow the user to test the operation of the relays RL1, RL2 and RL3 and the equipment in connection with that relay by moving the simulator switch SW1 to the left as shown in FIG. 4b, and depressed as shown in FIG. 5, and varying the resistance value of R66 which changes the value of the level indicating voltage. For the simulator testing, the level indicating voltage is varied, relative to the 6.8 volt DC supply, from 0 volts to approximately $-1.00$ volts DC which shows on the display 66 as 0 to 100 percent of full liquid level.

The noise generated by the operation of the digital display 66 will feed back to the 11.8 volt DC power supply and cause a change up and down in the 11.8 volt DC and the 6.8 volt DC power supplies. Without specific stabilizing circuitry, the noise generated in these supplies will feed back and cause unstable operation of the items which use this voltage, including the comparators U1B, U1C and U1D and the digital display 66. This feedback will cause operation in an unstable manner as long as the problem exists. The novel circuitry used to overcome this instability problem is shown in the simulation network 71. The 6.8 volt DC is used to supply the network which includes diodes D7, D8, D9 and R69. The diodes are used to provide a regulated voltage around the 6.8 volt DC supply of $+0.6$ and $-1.2$ volts minus the voltage drop across R69. By the use of this system of voltage regulation, noise problems causing display and control instability are significantly reduced. One of the reasons for improved stability is that this system of providing a regulated voltage around the 6.8 volt DC supply allows the voltage in the system to go up and down with the noise but at the same time it remains constant relative to the 0 volt output of the digital display because the 6.8 volt DC supply is connected as a 0 volt reference of the display driver. This interrelationship produces a balancing effect which almost completely eliminates noise problems caused by the digits going off and on.

Referring to FIG. 5, with respect to the control panel 73, starting at the top left and working down and to the right, the high level calibration knob 74 operates variable resistor R27, and the low level calibration knob 75 operates variable resistor R26. The operation mode display light 76 is LED5. The digital display characters 66 are found at DG1, DG2, and DG3 of FIG. 4c.

The minus sign (−) 90 of the digital display is held always on as shown in FIG. 4c by current applied through R41 to pin G of DG1 which lights a horizontal negative sign segment. By this means, level indicating voltages which indicate a level below 0 percent will be shown with a negative sign.

For level indicating voltages above 0 percent, referring to FIG. 4c, display driver U3 will turn on the vertical segments above 91 and below 92 the negative sign segment in DG1 by applying power from pin U3-20 to pins J and H of DG1 resulting in a positive sign (+) display.

In this aspect of the present invention, when the 0 percent set point is set above the bottom of the probe, or mis-set anywhere along the probe, if the liquid level or the level simulation adjustment goes below the 0 percent point, the negative sign is displayed. Without this negative signal capability, for example, a negative 5 reading would indicate an erroneous digital display of +5. This plus and minus display is a significant improvement over analog needle display systems which pin at a zero reading and cannot be used when the level goes below that zero function. With respect to the simulation network 71, the control panel simulation switch 77 is SW1, the knob 78 controls variable resistor R66 for level simulation, and the display light 79 for the simulation mode is LED4. With respect to the set point adjustments, the low level adjustment lever 80 operates variable resistor R28, the low level display light 81 is LED1, and the low level differential adjustment knob 82 operates variable resistor R31. The control level adjustment knob 83 operates variable resistor R29, the display light 84 is LED2 and the level differential adjustment knob 85 operates variable resistor R32. With respect to the high level set point, lever 86 operates variable resistor R30, the high level on light 87 is LED3, and the high level differential adjustment knob 88 operates variable resistor R33. The 0–1 milliamp terminals provide for remote display of the system if desired.

Thus, an improved capacitance bridge liquid level control system has been shown and described which provides substantial improvements both in the mechanical structure of the probe, and in various improved features in the electronic circuitry for the level control system. While one embodiment of the present invention has been shown and described, it will be obvious to those skilled in the art that changes and modifications may be made without departing from the invention in its broader aspects Therefore, the aim of the appended claims is to cover all such changes and modifications that fall within the true spirit and scope of the invention.

The invention is claimed as follows:

1. In a capacitance bridge liquid level control system for measuring the level of a liquid in a vessel, said level control system being of the type having a power supply, a signal generating oscillator, a capacitance bridge circuit for receiving a signal from said oscillator wherein a probe provides one plate of a capacitor thereof, and said bridge circuit being adapted for having a wall of a vessel providing an opposing plate of said capacitor thereof, wherein a change in the liquid level in said vessel causes a variance in the capacitance of said capacitor, a signal amplifying circuit for receiving and amplifying said signal from said capacitance bridge circuit, a level control circuit for receiving said amplified signal from said signal amplifying circuit and comparing same to a predetermined desired signal, and a display driver circuit for digitally displaying said amplified signal as a percentage of a full scale reading, an improvement for stabilizing the amplifier in said signal amplifying circuit wherein, a reference voltage is connected to said display driver circuit to display said reference voltage as a zero percent of full scale reading, diode means for regulating fluctuation in a positive input of said signal amplifier circuit about said reference voltage, and said diode means for regulating fluctuation in the positive input of said signal amplifier circuit balancing rapid current draw by said display driver circuit with the reference voltage varying but remaining constant relative to the zero reading output of said display driver circuit.

2. The capacitance bridge liquid level control system as described in claim 1 further including an improvement for damping rapid changes in display readings on said display driver circuit caused by splashing or boiling of said liquid in said vessel comprising:

capacitor means, coupled across an input and output of an operative amplifier in said signal amplifier circuit and in parallel circuitry with an amplifier gain adjustment resistive element, said resistive element being selectably variable to accommodate at least one of changes in probe length and refrigerant used in a vessel, said circuitry causing a ratiometric adjustment of a damping time constant to maintain the percentage effect of the damping as said amplifier gain resistive element is varied for at least one of differing length liquid level probes and differing refrigerants usable in said vessel.

3. The capacitance bridge liquid level control system as described in claim 1 wherein said digital display is a segmented digital display and said digital display driver circuit includes means in connection with said digital display for displaying negative indicia.

4. The capacitance bridge liquid level control system as defined in claim 1 wherein said level control circuit includes first comparative means for setting a first predetermined signal corresponding to a lower limit level of liquid for said vessel, a first relay activated when the value of said amplified capacitance bridge signals equals said first predetermined signal, and a first differential function in operative connection with said first comparative means setting a differential direction by a diode in a positive feedback circuit of said first comparative means causing a second signal to be in a first condition when said amplified capacitance bridge signal is at a liquid level equal to or slightly higher than the liquid level corresponding to the first predetermined signal, where the second signal is in a second condition at other times.

5. In a capacitance bridge liquid level control system for measuring the level of a liquid in a vessel, said level control system being of the type having a power supply, a signal generating oscillator, a capacitance bridge circuit for receiving a signal from said oscillator wherein a probe provides one plate of a capacitor thereof, and said bridge circuit being adapted for having a wall of a vessel providing an opposing plate of said capacitor thereof, wherein a change in the liquid level in said vessel causes a variance in the capacitance of said capacitor, a signal amplifying circuit for receiving and amplifying said signal from said capacitance bridge circuit, a level control circuit for receiving said amplified signal from said signal amplifying circuit and comparing same to a predetermined desired signal, and a display driver circuit for digitally displaying said amplified signal as a percentage of a full scale reading, an improvement comprising:

a simulator circuit positioned as an integral portion of said liquid level control system for selectably supplying one of a plurality of voltage levels to said level control circuit in place of said amplified signal from said signal amplifier circuit, said plurality of voltage levels having a value between zero and 100 percent of full scale display reading, means for selectively switching operative connection of one of said signal amplifier circuit and said simulator circuit with said level control circuit and said display driver circuit, a reference voltage connected to said display driver circuit to display said reference voltage as a zero percent of full scale reading, diode means for regulating fluctuation in a positive input of said signal amplifier circuit about said reference voltage, and said means of regulating fluctuation in the positive input of said signal amplifier circuit balancing rapid current draw by said display driver circuit with the reference voltage varying but remaining constant relative to the zero reading output of said display drive circuit.

6. In a capacitance bridge liquid level control system for measuring the level of a liquid in a vessel, said level control system being of the type having a power supply, a signal generating oscillator, a capacitance bridge circuit for receiving a signal from said oscillator wherein a probe provides one plate of a capacitor thereof, and said bridge circuit being adapted for having a wall of a vessel providing an opposing plate of said capacitor thereof, wherein a change in the liquid level in said vessel causes a variance in the capacitance of said capacitor, a signal amplifying circuit for receiving and amplifying said signal from said capacitance bridge circuit, a level control circuit for receiving said amplified signal from said signal amplifying circuit and comparing same to a predetermined desired signal, and a display driver circuit for displaying said amplified signal as a percentage of a full scale reading, an improvement wherein said liquid level control circuit includes:

comparative means for setting a predetermined signal corresponding to a lower limit level of liquid for said vessel, indicating means activated when the value of said amplified capacitance bridge signal equals said lower limit predetermined signal, and a differential function in operative connection with said comparative means for determining a first predetermined signal and set in a differential direction by a diode in a positive feed back circuit in said first comparative means causing said amplified capacitance bridge signal level required for deactivating said indicating means to be at a higher liquid level than said liquid level corresponding to said first predetermined signal.

7. In a capacitance bridge liquid level control system for measuring the level of a liquid in a vessel, said level control system being of the type having a power supply, a signal generating oscillator, a capacitance bridge circuit for receiving a signal from said oscillator wherein a probe provides one plate of a capacitor thereof, and said bridge circuit being adapted for having a wall of a vessel providing an opposing plate of said capacitor thereof, wherein a change in the liquid level in said vessel causes a variance in the capacitance of said capacitor, a signal amplifying circuit for receiving and amplifying said signal from said capacitance bridge circuit, a level control circuit for receiving said amplified signal from said signal amplifying circuit and comparing same to a predetermined desired signal, and a display driver circuit for digitally displaying said amplified signal as a percentage of a full scale reading, an improvement for stabilizing the amplifier in said signal amplifying circuit wherein, a reference voltage is connected to said display driver circuit to display said reference voltage as a zero percent of full scale reading, diode means for regulating fluctuation in a positive input of said signal amplifier circuit about said reference voltage, and said diode means for regulating fluctuation in the positive input of said signal amplifier circuit balancing rapid current draw by said display driver circuit with the reference voltage varying but remaining constant relative to the zero reading output of said display driver circuit, said digital display driver circuit includes means in connection with said digital display for displaying positive and negative indicia, said negative indicia digital display means includes a horizontal element which is energized whenever said digital display is energized, and said positive indicia display means includes vertical elements above and below said horizontal element which are energized by a signal from said signal amplifying circuit which is of a voltage greater than said reference voltage.

8. In a capacitance bridge liquid level control system for measuring the level of a liquid in a vessel, said level control system being of the type having a power supply, a signal generating oscillator, a capacitance bridge circuit for receiving a signal from said oscillator wherein a probe provides one plate of a capacitor thereof, and said bridge circuit being adapted for having a wall of a vessel providing an opposing plate of said capacitor thereof, wherein a change in the liquid level in said vessel causes a variance in the capacitance of said capacitor, a signal amplifying circuit for receiving and amplifying said signal from said capacitance ridge circuit, a level control circuit for receiving said amplified signal from said signal amplifying circuit and comparing same to a predetermined desired signal, and a display driver circuit for digitally displaying said amplified signal as a percentage of a full scale reading, an improvement for stabilizing the amplifier in said signal amplifying circuit wherein, a reference voltage is connected to said display drive circuit to display said reference voltage as a zero percent of full scale reading, diode means for regulating fluctuation in a positive input of said signal amplifier circuit about said reference voltage, and said diode means for regulating fluctuation in the positive input of said signal amplifier circuit balancing rapid current draw by said display driver circuit with the reference voltage varying but remaining constant relative to the zero reading output of said display driver circuit, said level control circuit includes first comparative means for setting a first predetermined signal corresponding to a lower limit level of liquid for said vessel, a first relay activated when the value of said amplified capacitance bridge signal equals said first predetermined signal, and a first differential function in operative connection with said first comparative means for determining a first predetermined signal and set in a differential direction by a diode in a positive feedback circuit of said first comparative means causing said amplified capacitance bridge signal required for deactivating said first relay to be at a higher liquid level than said liquid level corresponding to said first predetermined signal, second comparative means for setting a second predetermined signal corresponding to a desired control level of liquid in said vessel, a second relay activated when the value of said amplified capacitance bridge signal equals said second predetermined signal, a second differential function in operative connection with said second comparative means for determining a second predetermined signal and set in a differential direction by a diode in a positive feedback circuit of said second comparative means causing said amplified capacitance bridge signal required for deactivating said second relay to be at a higher liquid level than said liquid level corresponding to said second predetermined signal, and third comparative means for setting a third predetermined signal corresponding to an upper limit level of liquid for said vessel, a third relay activated when the value of said amplified capacitance bridge signal equals said third predetermined signal, a third differential function in operative connection with said third comparative means for determining a third predetermined signal and set in a differential direction by a diode in a positive feedback circuit of said third comparative means causing said amplified capacitance bridge signal required for deactivating said third relay to be at a lower liquid level than said liquid level corresponding to said third predetermined signal.

* * * * *